(12) United States Patent
Chin et al.

(10) Patent No.: US 7,571,079 B2
(45) Date of Patent: Aug. 4, 2009

(54) AWARE AND ACTIVE FEATURES FOR COMPUTER-AIDED DESIGN SYSTEMS

(75) Inventors: Ricardo Chin, Shrewsbury, MA (US); Robert Siegel, Lexington, MA (US)

(73) Assignee: Dassault Systems Solidworks Corporation, Concord, MA (US)

( * ) Notice: Subject to any disclaimer, the term of this patent is extended or adjusted under 35 U.S.C. 154(b) by 475 days.

(21) Appl. No.: 11/336,465

(22) Filed: Jan. 20, 2006

(65) Prior Publication Data

US 2006/0184343 A1 Aug. 17, 2006
US 2007/0239406 A9 Oct. 11, 2007

Related U.S. Application Data

(60) Provisional application No. 60/647,868, filed on Jan. 26, 2005.

(51) Int. Cl.
*G06F 17/50* (2006.01)
(52) U.S. Cl. ............... 703/2; 703/1; 703/7; 700/98; 700/182
(58) Field of Classification Search ............... 703/1, 703/20, 22, 2, 7; 700/182, 249, 98; 345/419
See application file for complete search history.

(56) References Cited

U.S. PATENT DOCUMENTS

| | | | |
|---|---|---|---|
| 5,581,466 A | | 12/1996 | Van Wyk et al. |
| 5,815,154 A | | 9/1998 | Hirschtick et al. |
| 6,018,628 A | * | 1/2000 | Stoutamire .................. 717/147 |
| 6,256,596 B1 | | 7/2001 | Leite, Jr. et al. |
| 6,292,715 B1 | * | 9/2001 | Rongo ....................... 700/249 |
| 6,507,806 B1 | * | 1/2003 | Tandler ........................ 703/1 |
| 6,525,745 B1 | | 2/2003 | Phelan et al. |
| 6,629,065 B1 | | 9/2003 | Gadh et al. |
| 6,888,542 B1 | | 5/2005 | Clauss |
| 6,898,560 B1 | | 5/2005 | Das |
| 2002/0107673 A1 | | 8/2002 | Haller et al. |
| 2003/0085889 A1 | * | 5/2003 | Chin et al. .................. 345/419 |

(Continued)

FOREIGN PATENT DOCUMENTS

EP 0 631 251 A2 12/1994

(Continued)

OTHER PUBLICATIONS

Archibald, M., "Mechanical Engineering Design with Pro/ENGINEER Release 2001," pp. 2-1 to 2-54 (Jun. 19, 2001).

(Continued)

*Primary Examiner*—Thai Phan
(74) *Attorney, Agent, or Firm*—Hamilton, Brook, Smith & Reynolds, P.C.

(57) ABSTRACT

Processing data in a computer-aided design (CAD) system includes determining that a feature of a three-dimensional model has a condition that requires correction. The condition is automatically corrected by performing an action. The action may be an action that reorders a sequence of features in the three-dimensional model, an action that changes at least one parameter of the feature, an action that deletes a feature reference, or an action that changes a feature reference. Furthermore, the action may have one or more constraints that bound the action to a set of features that are directly and indirectly related to the feature on which the action operates.

23 Claims, 12 Drawing Sheets

U.S. PATENT DOCUMENTS

2004/0153202 A1\* 8/2004 Landers et al. ............ 700/182
2005/0071042 A1 3/2005 Subrahmanyam et al.

FOREIGN PATENT DOCUMENTS

| EP | 1 302 904 A2 | 4/2003 |
|----|--------------|--------|
| EP | 1 686 501 A2 | 8/2006 |
| JP | 62-024371 | 2/1987 |
| JP | 62-251965 | 11/1987 |
| JP | 02-132573 | 5/1990 |
| JP | 04-364583 | 12/1992 |
| JP | 06-103342 | 4/1994 |
| JP | 07-129630 | 5/1995 |
| JP | 08-096166 | 4/1996 |
| JP | 01-034657 | 2/2001 |
| JP | 03-162550 | 6/2003 |
| JP | 06-209763 | 8/2006 |

OTHER PUBLICATIONS

"A Pro/ENGINEER tip for CAD Drawings," May 2001, retrieved on Feb. 6, 2007 from http://www.synthx.com/tom/sy_tip_0105.htm, pp. 1-3.

Su, C.J., et al., "An Integrated Form-Feature-Based Design System for Manufacturing," *Journal of Intelligent Manufacturing*, Chapman and Hall, London, GB 6(5): pp. 277-290 (Oct. 1995).

Sormaz, D.N., et al., "Modeling of Manufacturing Feature Interactions for Automated Process Planning," *Journal of Manufacturing Systems Soc. Manuf. Eng USA*, 19(1): pp. 28-45 (2000).

Allada, V., et al., "Feature-Based Modelling Approaches for Integrated Manufacturing: State-of-The-Art Survey and Future Research Directions," *International Journal of Computer Integrated Manufacturing UK*, 8(6): pp. 411-440 (Nov. 1995).

Boris Mayer St-Onge, "Pro/ENGINEER Tutorial Home Page," May 29, 1998, retrieved from "http://wwwrobot.gmc.ulaval.ca/interne/documentation/proeng/" on Dec. 15, 2005, pp. 1-8 and 1-15.

TechniCom eWeekly document, Issue 90, May 31, 2001.

Birgand, J., et al. "Technologie de Conception Mécanique (TCMEC)," *Ecole Centrale De Nantes*, France (2001).

Chase, K., et al. "A Comprehensive System for Computer-Aided Tolerance Analysis of 2-D and 3-D Mechanical Assemblies," *Proceedings of the 5th International Seminar on Computer-Aided Tolerancing*, Toronto, Canada (1997), ADCATS Publication #97-4.

Patent Abstracts of Japan, Publication No. 63-239557, vol. 013, No. 043, Jan. 31, 1989.

Treacy, P. et al, "Automated Tolerance Analysis for Mechanical Assemblies Modeled With Geometric Features and Relational Data Structure," *Computer-Aided Design*, 23:6, pp. 444-453, (1991).

Anonymous, "SMLib Functionality," Internet Citation [Online], retrieved from Internet: http://web.archive.org/web/20040622180 on Aug. 23, 2006, pp. 1-38.

Tech Tips, "How to Maximize Your Use of Fillet Features in SolidWorks Level = Intermediate," Internet Citation [Online], retrieved from Internet: http://web.archive.org/web/20031216103401 on Jul. 15, 2008, pp. 1-5.

Vida, J., et al., "A Survey of Blending Methods That Use Parametric Surfaces," *Computer Aided Design* 26(5):341-365 (1994).

\* cited by examiner

FIG. 5B

| Reorder Graph Example | | | | | | | | | | | | | | | |
|---|---|---|---|---|---|---|---|---|---|---|---|---|---|---|---|
| Snapshot of AAF (Feature 8) and its related features | | | | | | | | | | | | | | | |
| | | | | | | | | AAF | | | | | | | |
| Feature | 1 | 2 | 3 | 4 | 5 | 6 | 7 | 8 | 9 | 10 | 11 | 12 | 13 | 14 | 15 |
| Adjacent | | | | | Adjacent | Adjacent | | *** | | | | Adjacent | | Adjacent | |
| Parent/Child | | Parent | | | Parent | | | *** | Child | Child | | | Child | | |
| Reorder Earlier/Later | | | Later | | Later | | | *** | Later | Earlier | | Earlier | Earlier | | |
| Failed | | | | Failed | | | | *** | | | | | Failed | | |
| | | | | | | | | | | | | | | | |
| Scoring | | | | | | | | | | | | | | | |
| Feature 5 | | | | | | | | | 6 | 6 | 6 | 6 | 6 | 6 | 6 |
| Feature 10 | 6 | 6 | 6 | 6 | 6 | 6 | | | | | | | | | |
| Feaure 12 | 2 | 2 | 2 | 2 | 2 | 2 | | | | | | | | | |
| Feature 13 | 10 | 10 | 10 | 10 | 10 | 10 | | | | | | | | | |
| Sub Total | 18 | 18 | 18 | 18 | 18 | 18 | 0 | 0 | 6 | 6 | 6 | 6 | 6 | 6 | 6 |
| | | | | | | | | | | | | | | | |
| Reduce by Adjacent | | | | | | | | | | | | | | | |
| Feature 5 | -1 | -1 | -1 | -1 | | | | | | | | | | | |
| Feature 6 | -1 | -1 | -1 | -1 | -1 | | | | | | | | | | |
| Feature 12 | | | | | | | | | | | | | -1 | -1 | -1 | -1 |
| Feature 14 | | | | | | | | | | | | | | | -1 | -1 |
| Adjacent Sub Total | -2 | -2 | -2 | -2 | -1 | 0 | 0 | 0 | 0 | 0 | 0 | | -1 | -1 | -2 | -2 |
| | | | | | | | | | | | | | | | |
| Total Score | 16 | 16 | 16 | 16 | 17 | 18 | 0 | 0 | 6 | 6 | 6 | 5 | 5 | 4 | 4 |
| | | | | | | | | | | | | | | | |
| Result | | | | | | | | | | | | | | | | |
| The AAF (feature 8) is to be reordered after feature 6 since it has the highest score. | | | | | | | | | | | | | | | |
| | | | | | | | | | | | | | | | |
| Notes: | | | | | | | | | | | | | | | |
| Feature 2 is a parent, but does not need to reorder, so it has no effect on the score | | | | | | | | | | | | | | | |
| Feature 3 wants to reorder later, but it has no effect on the score since it has no relationship to feature 8 | | | | | | | | | | | | | | | |
| Feature 5 is a parent that wants to reorder later, so it will have an effect on the score | | | | | | | | | | | | | | | |
| Feature 9 is a child, but it wants to reorder later, which has no effect | | | | | | | | | | | | | | | |
| Feature 10 is a child that wants to reorder earlier, so it does effect the score | | | | | | | | | | | | | | | |
| Feature 12 is a later adjacent feature which wants to reorder ealier, so it effects scoring | | | | | | | | | | | | | | | |
| Feature 13 is a child which wants to reorder earlier. It also has a failed status, which means it has a larger effect on scoring | | | | | | | | | | | | | | | |
| Features 5, 6, 12, and 14 are geometrically adjacent to the AAF, which means they will be used to adjust scoring down. | | | | | | | | | | | | | | | |

AWARE AND ACTIVE FEATURES FOR COMPUTER-AIDED DESIGN SYSTEMS

This application claims priority to U.S. Provisional Patent Application No. 60/647,868 filed Jan. 26, 2005 and entitled "Aware and Active Features in Computer Aided Solid Modeling."

FIELD

This application relates to Computer-Aided Design (CAD), and more particularly, to ordering of features in 3D feature-based CAD modeling systems.

BACKGROUND OF THE INVENTION

CAD products may be used to design and capture the three-dimensional (3D) shapes that are designed by engineers. Such 3D CAD products have evolved over the years and different levels of this technology are still used today. In the order of the earliest to most recent 3D technology developed, CAD products include 3D wireframe modeling, 3D surface modeling, 3D solid modeling, and 3D feature-based modeling. Wireframe modeling systems capture only the edges of a model. The edges are defined by geometry consisting of lines, arcs, and other types of curves. Three-dimensional surface modeling systems extend the functionality of wireframe modeling systems one step further by also defining surfaces in the CAD model. By way of non-limiting example, surfaces can include planes, cylinders, and cones.

Three-dimensional solid modeling systems combine wireframe and surface geometry techniques in such a way that the systems have knowledge of the connectivity of all the geometry in a part. A 3D solid modeling system keeps track of which edges border a surface and which two surfaces intersect to define an edge. This geometric "book-keeping" is done for the user by solid modeling software. Primitive solid shapes such as blocks, cylinders, and cones can be combined, and the software system ensures that all the geometry is connected in such a way so that a "water-tight" model is maintained.

Three-dimensional feature-based CAD modeling systems extend solid modeling techniques still further. Rather than constructing models as a collection of simple geometric primitives, 3D feature-based CAD modeling systems use features. Some examples of features include an extrusion created by extruding a shape a specified distance, a fillet that rounds one or more sharp edges in a model, a shell that hollows out a model of a part or a portion thereof, and a hole. Information regarding the definition of a feature can be captured. This information can describe how to construct the feature and can include parameters, such as a diameter of a hole. The definition of a feature also can include geometry referenced from previously defined features (e.g., a definition of a hole can include a distance from an edge of some previously created feature to specify the location of the hole). By capturing this type of information, 3D feature-based CAD modeling systems have the ability to update features as needed when a change is made. For example, by changing a parameter that specifies a diameter of a hole, the geometry of the hole can be updated to reflect the new diameter. If a parent feature (i.e., a previously defined feature having a hierarchical path to subordinate features) changes, subsequently defined features that implicitly reference the parent feature as a result of the hierarchical relationships of the features (hereinafter referred to as children or child features) will be updated to maintain the previously defined relationship, such as the hole maintaining a distance from an edge in a parent feature.

Due to parent/child relationships between features that are created and updating that occurs as a consequence of the dependency of a child feature upon that child feature's parent or parents, the sequence or order of the features in the hierarchical data structure is very important. In 3D feature-based CAD modeling systems, a parent should always be defined prior to any of its dependent children (e.g., a face feature having a size on which a hole feature's location is dependent).

In addition to parent/child relationships, feature order can influence the resulting geometry of a model and the extent to which updates, which may be needed when a change is made to the model, will be successful. Moreover, the combinations of references and the types of references used in the definition of a feature also can influence the geometry of a model and the extent to which updates will be successful.

An ordered list of features provides a recipe for constructing a model in a 3D feature-based CAD modeling system, or feature-based modeler. The recipe is evaluated in order when the model needs to be updated, such as, by way of non-limiting example, when a change is made to the model. Under certain circumstances, however, after a change or changes are made to a model, the CAD system may be unable to update one or more features successfully. Problems that may prevent a successful update include geometry from an earlier-defined feature being too small to accommodate geometry from a later-defined feature or references used in the definition of a feature no longer existing or accessible in the model. The kinds and combinations of problems that can occur in a model can be overwhelming for a user. When a problem occurs, a CAD system may identify the features that cannot successfully update so that the user can begin the process of manually fixing or manually reordering the features of the model with the goal of ordering the features in such a way as to enable successful updates.

Models can contain hundreds of features, and managing and fixing the order of features in a model hierarchy and the relationships among various features in a model can be very time consuming for the user. Fixing problems once the problems occur demands a great deal of insight from the user with regards to how all the features interact to define a model (e.g., parent-child relationships and cross-references). Problem solving also requires forethought with regards to defining features, with the interrelationships of various features in mind to promote the best chance of successfully updating the features. As a result, 3D feature-based CAD modeling systems can be difficult to use, even with models of modest complexity.

SUMMARY OF THE INVENTION

In general, in one aspect, the present invention features a computer-implemented method for processing data in a CAD system. The method includes determining that a feature of a three-dimensional model has a condition that requires correction. Action is taken to automatically correct the condition. The action is chosen from a number of actions, which include actions that reorder a sequence of features in the three-dimensional model, actions that change at least one parameter of the feature, and actions that delete or change feature references. Furthermore, the action has one or more constraints that bound the action to a set of features that are directly and indirectly related to the feature on which the action operates.

Implementations may include features such as, by way of non-limiting example, notification via an event-driven mechanism that aids in determining that the feature has a condition that requires correction. Additionally, among the considerations when an action results in reordering the sequence of features are, with respect to one or more features, whether that feature is a parent feature or a child feature with respect to related features, and the feature type. By way of non-limiting example, if the feature is a fillet feature and a related feature is a draft feature, the draft feature can be ordered prior to the fillet feature, and a large fillet feature can be ordered prior to a smaller fillet feature, increasing the likelihood of successful updating to the model.

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

FIG. 5B illustrates an example of a reorder graph.

DETAILED DESCRIPTION OF THE INVENTION

Figure 1:
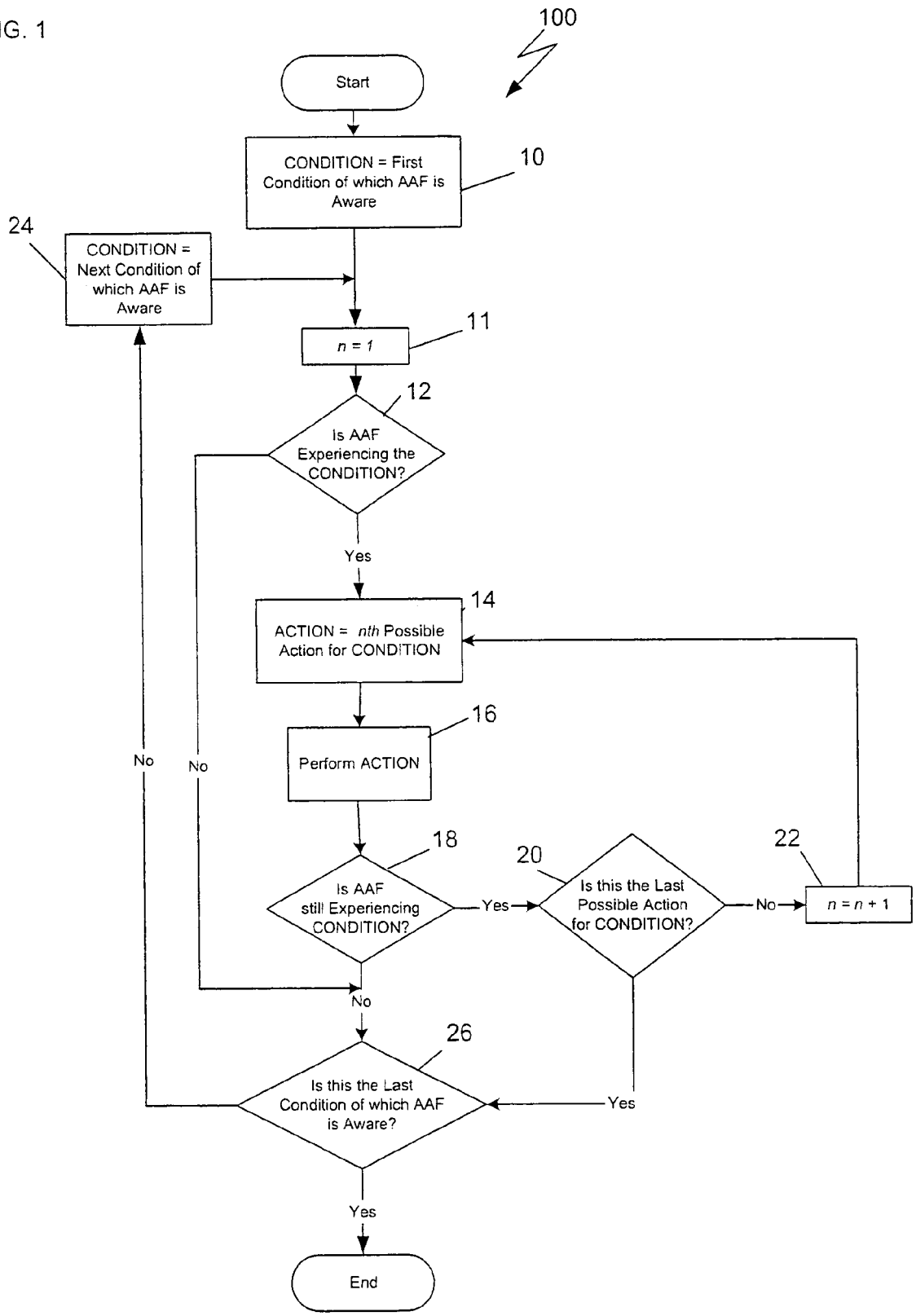
FIG. 1 illustrates a procedure that evaluates and responds to a condition.

The present invention provides for aware and active features (hereinafter also referred to as AAFs) in a 3D feature-based CAD modeling system. Aware and active features enhance the capabilities of features generated by a 3D feature-based CAD modeling system and significantly reduce the responsibility of a user of the 3D feature-based CAD modeling system with regards to feature management. When changes are made to a model that cause a failure or other undesirable condition of one or more existing features, aware and active features automatically self-repair. Self-repair can occur by, for example, changing internal references, parameter settings, feature order, or a combination thereof. By building in the ability for features to self-repair, 3D feature-based CAD modeling systems become significantly easier to use.

An AAF is a feature that is capable of being aware of and responding to an undesirable condition. Rather than having a CAD system that attempts to oversee and manage all the features of a model, the present invention described herein empowers individual features to manage the repair of an undesirable condition based on characteristics of that particular condition, and based on direct and indirect relationships with other features.

AAFs can recognize a number of undesirable conditions. Types of conditions include localized conditions, which are conditions of a modeled part or assembly to which the AAF belongs, or conditions of one or more related features (e.g., a parent, children, a referenced feature, or a feature that is adjacent or geometrically connected to the AAF). Conditions can include, but are not limited to, an update status of the AAF (e.g., whether a failure has occurred during an updating process), a missing reference, and the presence of invalid geometry.

To respond to a condition, AAFs can take a number of actions to repair the condition. Such actions can include, but not be limited to, changing one or more of the parameters used to define the AAF, changing or deleting references, changing position in the feature order, splitting a feature into multiple features, and merging a feature with other features.

For efficiency of operation, one skilled in the art may wish to limit the number of conditions that an AAF may identify. Similarly, the number of corrective actions an AAF can take to respond to a condition also may be limited to maximize the efficiency of the modeling system.

A modeling system that utilizes AAFs has the advantage of not requiring the oversight and management of all the features of a model from a high level programmatically. The scope of features being evaluated is bounded by features that are related directly or indirectly to one another, and therefore, a localized rather than a global analysis is required. An AAF only responds to a condition that internally affects that particular AAF. Moreover, if an action taken by an AAF causes a condition in another AAF, the other AAF is responsive to the condition.

Generally, all feature types in a model are capable of having generic AAF capabilities, such as managing the position within the model's feature order. Certain feature types (e.g., fillets, drafts, and shells), can have additional AAF capabilities beyond generic capabilities. The AAF capabilities can be built into the functionality of existing CAD products, and can include data constructs that direct the behavior of traditional features.

Referring now to FIG. 1, a procedure 100 is shown that evaluates and responds to a condition (e.g., situations that cause errors to or failure of an AAF). The evaluation leads to invoking one or more actions to correct the condition. Conditions may include the failure status of an AAF, the failure status for one or more features related to an AAF, a condition indicated by setting a flag in an AAF or a related feature (e.g., when a feature attempts but fails to reorder itself), and a condition indicated by setting a flag in the model's data structure. An AAF may check its failure status, and may check one or more indicators of the status of one or more related features.

The procedure 100 begins by evaluating the first condition of which the subject AAF is aware (step 10) and setting a variable n to 1 (step 11), which will be used to cycle through a set of prescribed actions for the condition. As mentioned, AAF actions may include changing the AAF's parameters, references, and position in the feature order. Typically, actions are taken by an AAF for self repair.

The procedure 100 then checks to see if the AAF is experiencing the condition being evaluated (step 12), in which case, the condition may require the AAF to change. One way in which an AAF may check whether a condition is occurring is by evaluating a status flag. If the AAF is not experiencing the condition and if all conditions have not yet been examined (step 26), the procedure 100 proceeds to evaluate the next condition of which the AAF is aware (step 24).

Implementations may, however, be event driven, meaning that rather than checking whether a condition is occurring (e.g., by evaluating a status flag), an AAF may be awakened by a software interrupt that indicates that a particular condition is present. Thus, an AAF can be notified automatically of an event. Such events can include, for example, the change of one or more status flags or the setting of one or more particular flags. Automatic notification may be established implicitly, based on feature relationships (e.g., parent, child, and cross-part associations), or explicitly, for example, by a user of the CAD modeling system.

If the AAF is experiencing the condition being evaluated (step 12), the AAF determines a first action in response to the condition (step 14). For the condition being experienced by the AAF, the AAF attempts to address the condition by employing one or more actions. The AAF performs each action (step 16) until the AAF no longer experiences the condition (tested in step 18) or until every action has been taken (tested in step 20).

The AAF examines each condition via an iterative process, which includes setting the condition being examined (initially step 10, and subsequently step 24) until all conditions have been examined (step 26). As previously mentioned, however, rather than an iterative process, an event may interrupt the AAF, in which case data may be provided with the event interrupt that indicates the condition being experienced.

Figure 2:
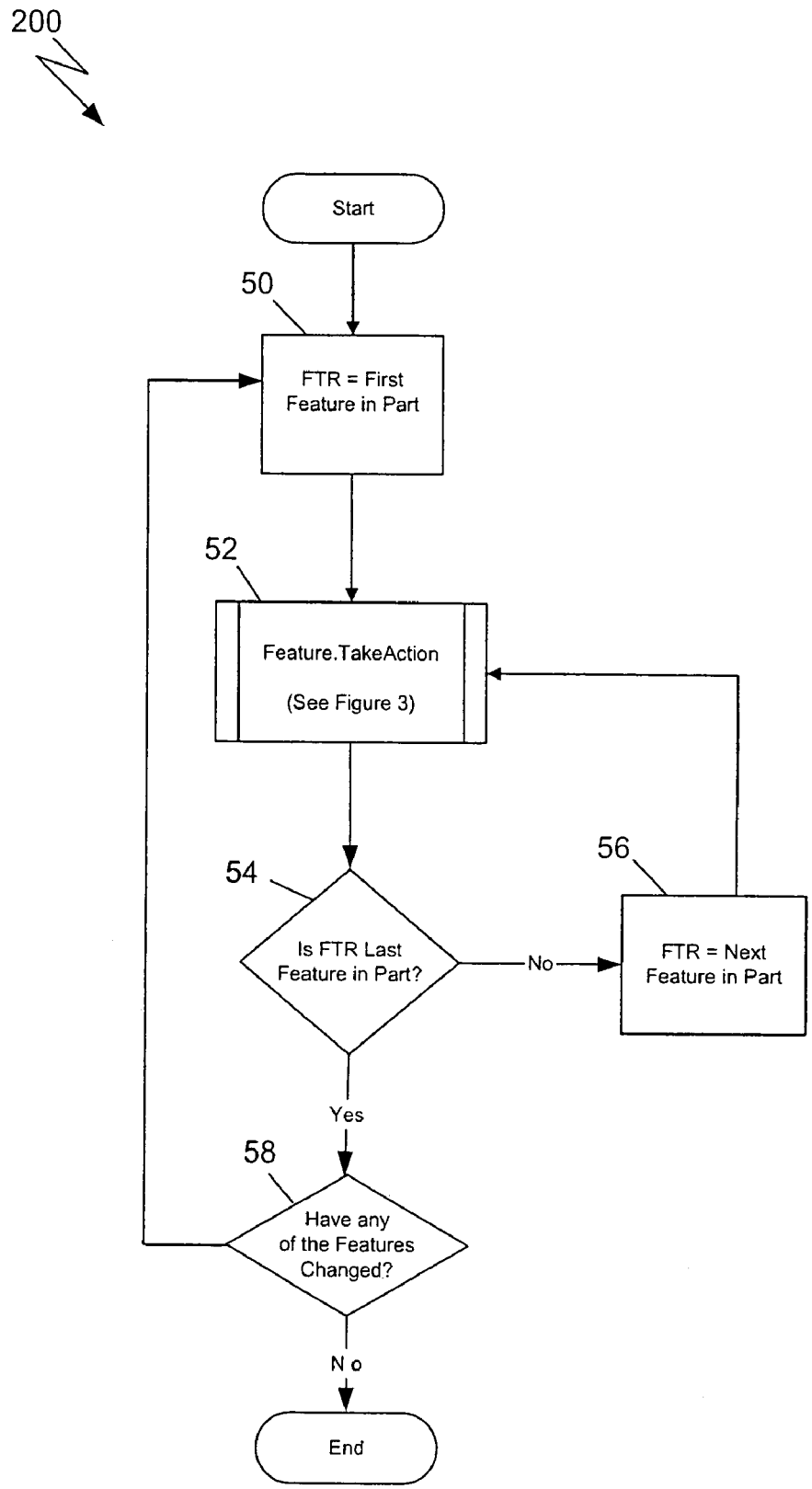
FIG. 2 illustrates a procedure that iterates through each active and aware feature in a modeled part.

FIG. 2 illustrates an iterative procedure 200 that iterates through the AAFs of a part belonging to a model. Note that the general flow through a part's AAFs is defined by the feature order in the part (also known as feature history), which initially is established according to the order in which the features are created. Hereinafter, the AAF that is being operated on is referred to as the target AAF or target feature. Iterations through the part's AAFs continue so long as at least one feature in the part has changed during the last iteration (step 58). Beginning with the first AAF in the part (step 50), action is taken for each AAF (step 52), which is illustrated in more detail in FIG. 3. If, after cycling through all AAFs in the part (step 54 and step 56), one or more features have changed in the current iteration (tested in step 58), the procedure 200 returns to the first AAF to begin the iteration cycle again (step 50).

Figure 3:
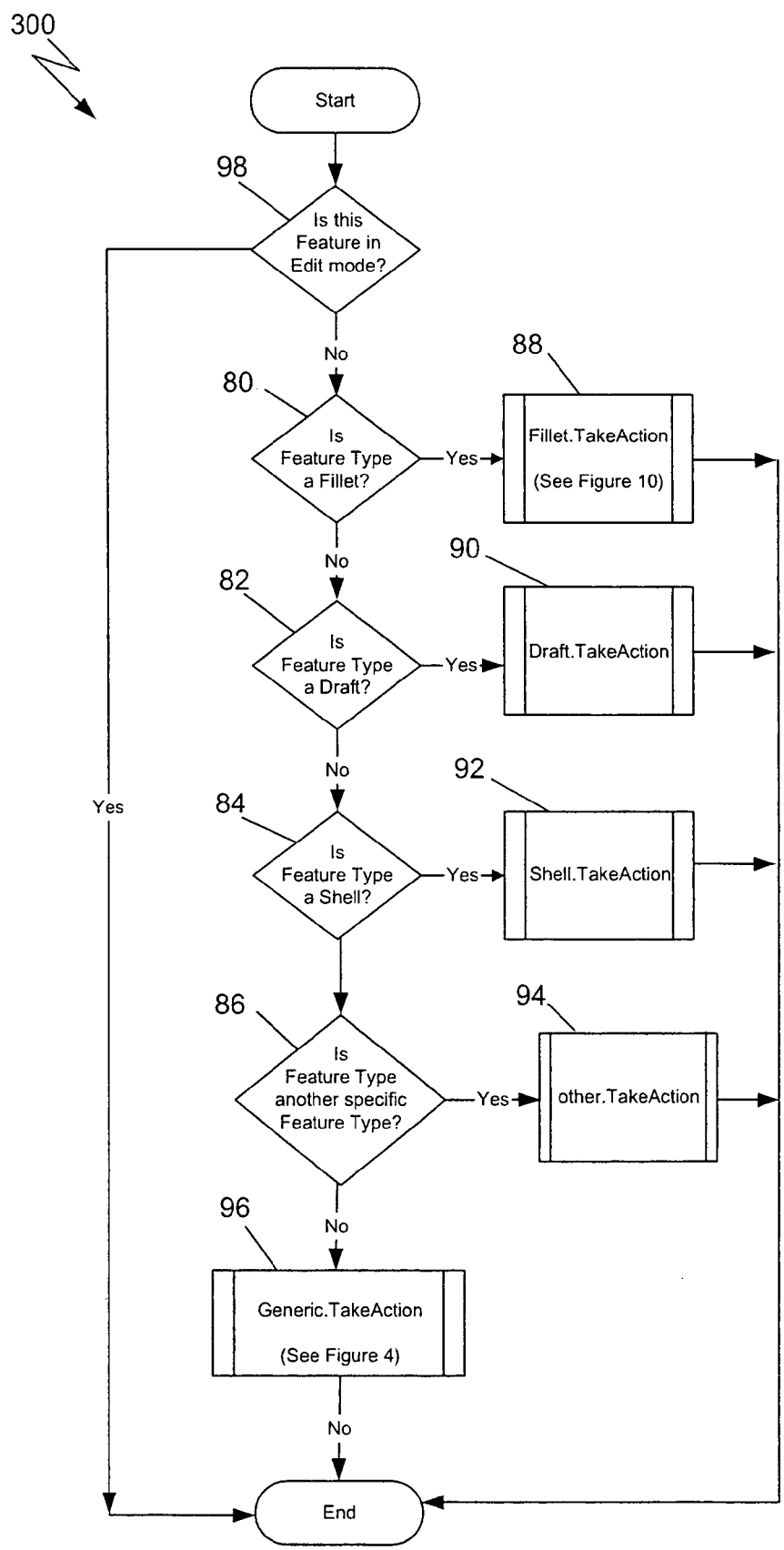
FIG. 3 illustrates a procedure that initiates the appropriate action depending on the active and aware feature type.

Referring now to FIG. 3, procedure 300 illustrates in detail step 52 of FIG. 2. So long as the AAF is not in edit mode (tested in step 98 and later discussed with reference to step 108 in FIG. 4), procedure 300 initiates the appropriate action depending on the AAF feature type. Procedure 300 checks the feature type of the AAF, including whether the feature type is a fillet (step 80), a draft (step 82), a shell (step 84), and other specific feature types (step 86). Procedure 300 then proceeds to execute the process that handles the target AAF feature type (step 88, 90, 92 or 94, respectively). For example, if the feature type of the target AAF is a fillet, procedure 300 executes the process that pertains to fillets (step 88), as will be described in more detail with reference to FIG. 10. If no specific feature type is associated with the target AAF, procedure 300 executes a generic process (step 96), as will be described in more detail with reference to FIG. 4.

Figure 4:
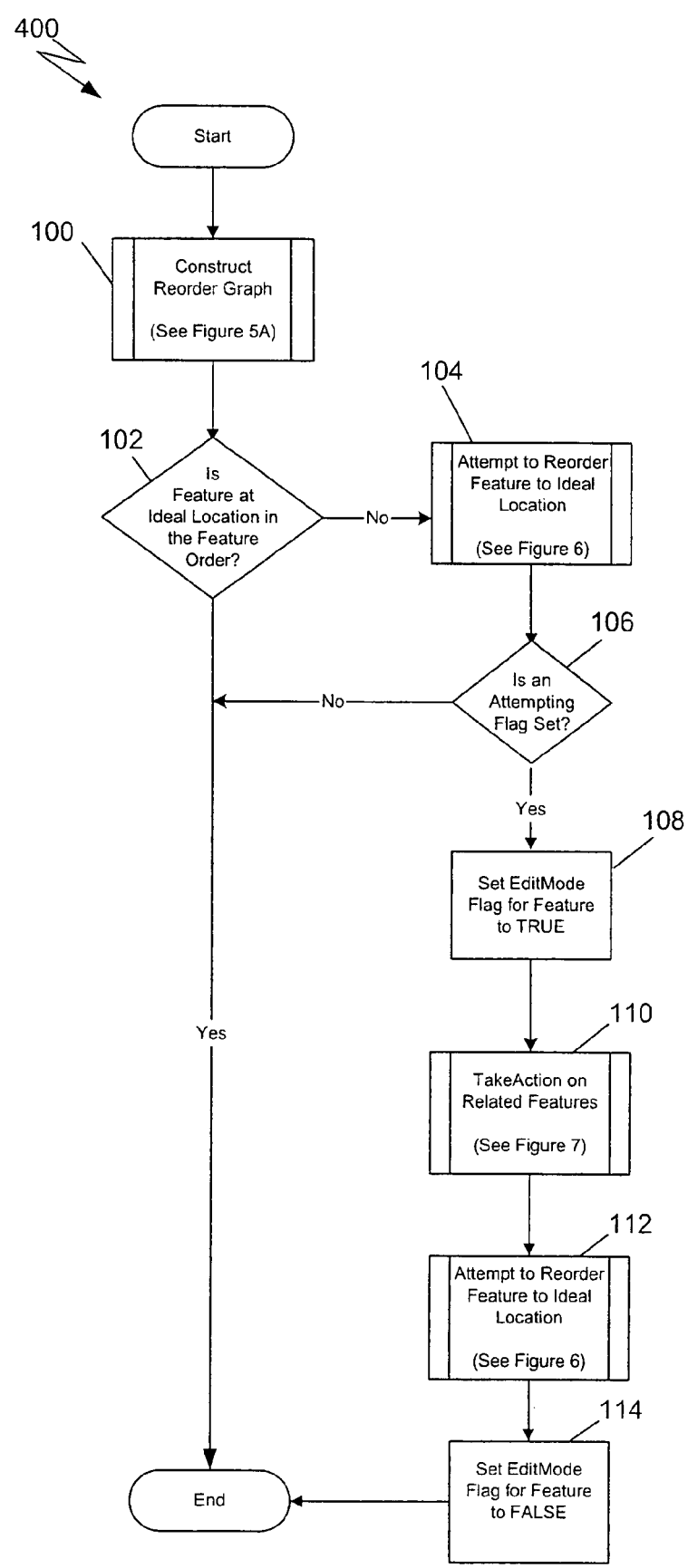
FIG. 4 illustrates a procedure for a generic action.

Referring now to FIG. 4, a generic action procedure 400 is shown. The procedure 400 begins by constructing a reorder graph (step 100), which is illustrated in more detail in FIG. 5A. Procedure 400 then tests whether the target AAF is at an ideal location in the feature order based on the reorder graph (step 102), and if so, procedure 400 ends. If the target AAF is not at an ideal location in the feature order, an attempt is made to reorder the target AAF in the feature sequence (step 104), which may be represented as a feature hierarchy. Procedure 400 next checks whether an Attempting flag is set (step 106). When set, the Attempting flag denotes that the target AAF is unable to reach an ideal location, features related to the target AAF may take action, which then may result in the target AAF's being able to reach an ideal location. In this case, an EditMode flag for the target AAF is set to TRUE (step 108) and procedure 400 then executes procedure TakeAction on Related Features (step 110), described in more detail in FIG. 7, to take action on features related to the target AAF.

Figure 6:
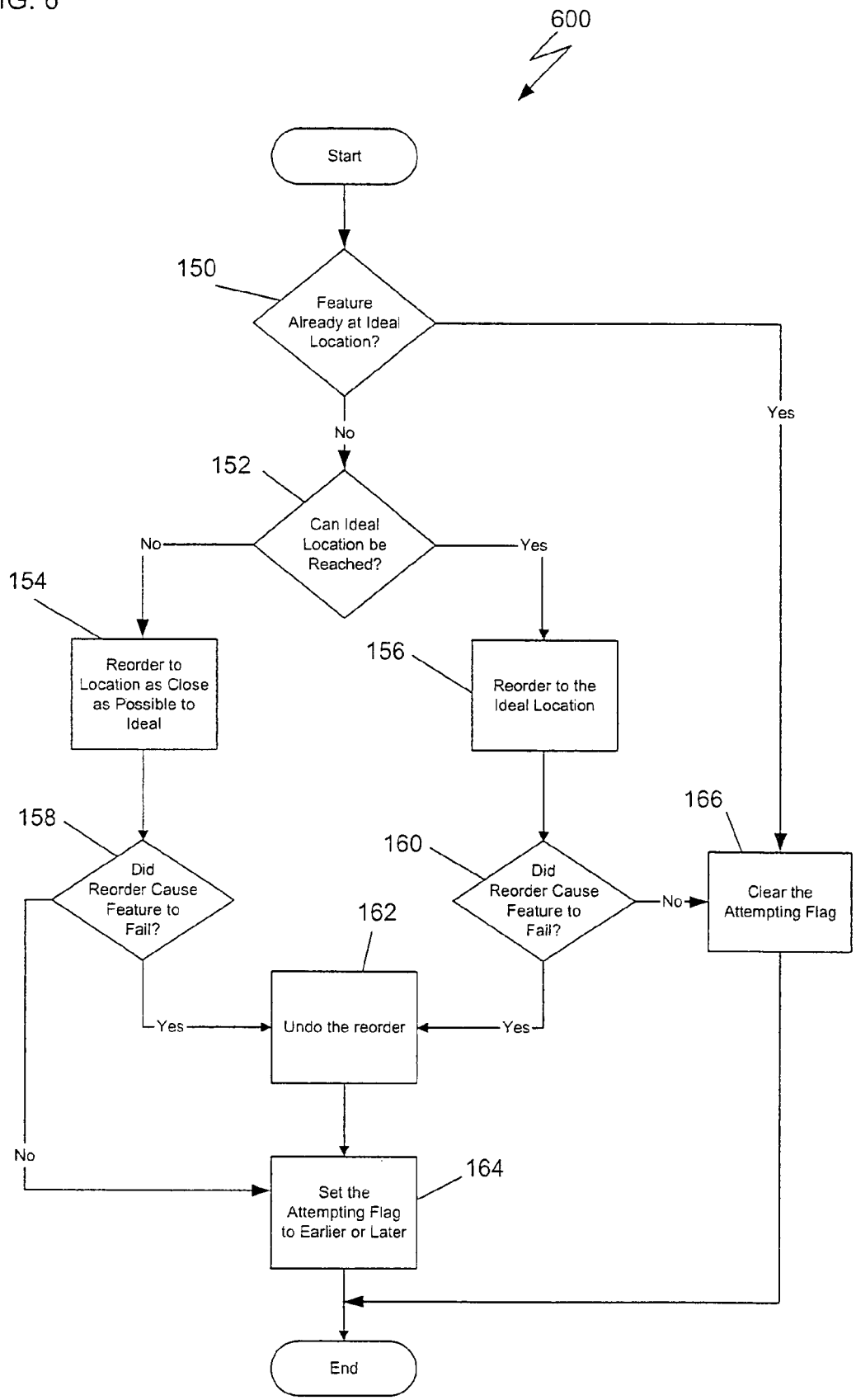
FIG. 6 illustrates a procedure that attempts to reorder an active and aware feature.

After action on related features (step 110) has been taken, procedure 400 again attempts to reorder the target AAF in the feature order (step 112), as described in more detail in FIG. 6; sets EditMode flag for the target AAF to FALSE (step 114) and ends.

In a preferred embodiment, the procedure TakeAction on Related Features (step 110) is called recursively and operates on parent, child, and adjacent features, as well as other features that have a relationship with the target AAF. While the TakeAction on Related Features procedure (step 110) may be called recursively, it must not be called more than once for any one of the AAFs that is related to the target AAF.

Figure 5A:
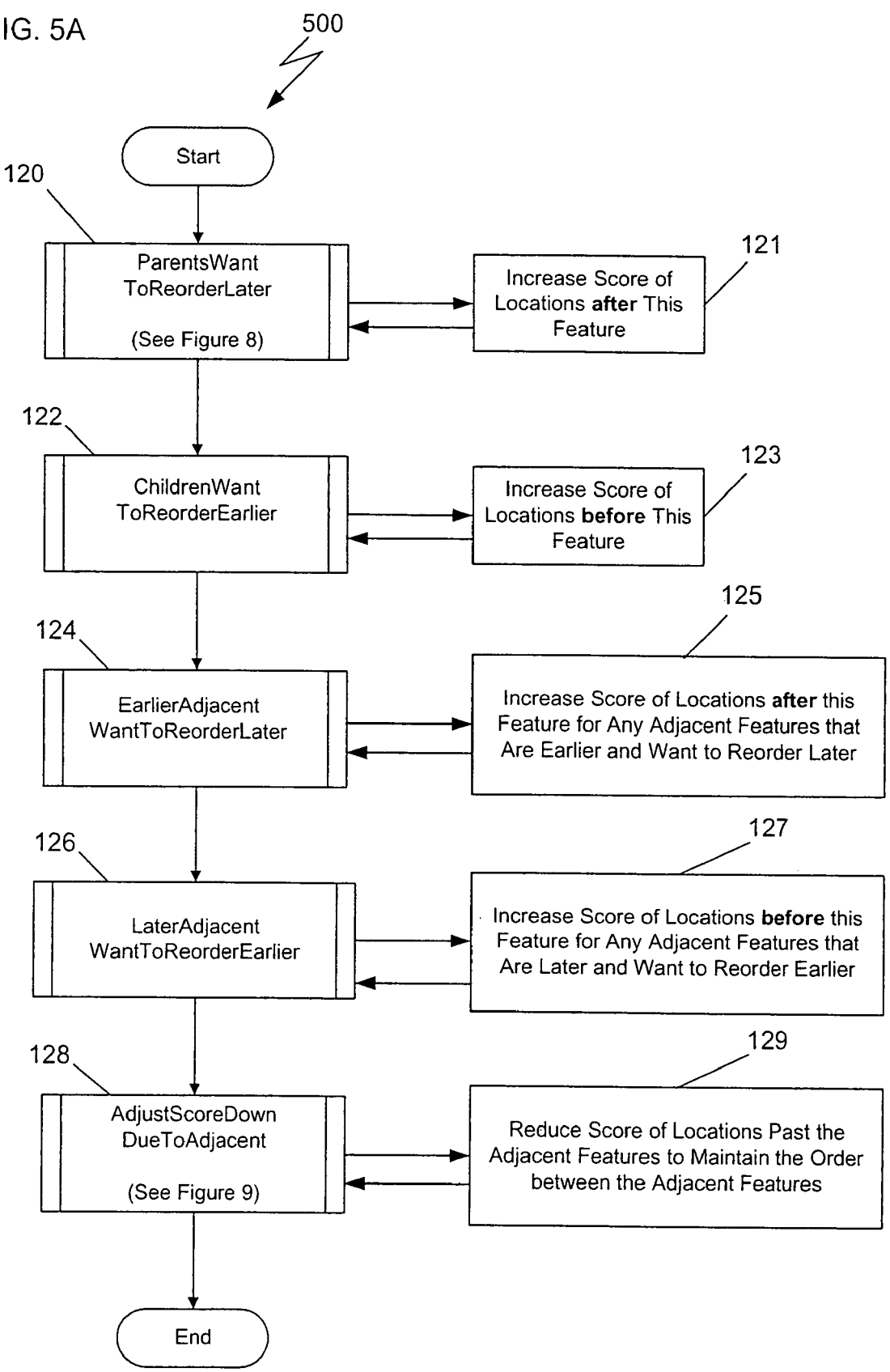
FIG. 5A illustrates a procedure that constructs a reorder graph.

Referring now to FIG. 5A, procedure 500 constructs a reorder graph for a target feature. The reorder graph (an illustrative example of which is shown in FIG. 5B) represents a calculated score for each feature location in the part. The score is used to determine and reorder the location of the features in the feature order. Generally, the ideal location for an AAF in the feature order is determined based on the type of reordering that related features are attempting to perform. Related features include parent, child, and geometrically adjacent features. Procedure 500 can create a reorder graph of features related to the target feature, including parents of the target feature that want to reorder later in the feature sequence (step 120 and step 121), which is discussed more fully with reference to FIG. 8, children that want to reorder earlier in the feature sequence (step 122 and step 123), earlier adjacent features that want to reorder later in the feature sequence (step 124 and step 125), and later adjacent features that want to reorder earlier in the feature sequence (step 126 and step 127). The location score is then adjusted down (step 128 and step 129) to maintain the order relationship between adjacent features, as will be further described with reference to FIG. 9.

FIG. 5B provides an exemplary reorder graph for an exemplary target AAF (Feature 8) in a part having fifteen (15) features. Based on the descriptions in FIG. 5A for each reorder routine shown therein, score values can be added to feature locations before and/or after the target feature. The reorder graph lists the relationship of each feature to the target feature (e.g., Feature 5 is listed as an adjacent and a parent feature that preferably will be reordered later). Based on this relationship, and consistent with the exemplary score values of the embodiment of FIG. 8, score values of "6" are added to each location corresponding to the features after Feature 8, as indicated under the left column heading "Scoring" in the row beginning "Feature 5" in FIG. 5B. Other score values are indicated, with the Notes shown in FIG. 5B indicating the effect of each related feature. When each of the score values is added for each location, the ideal location for the target feature can be taken as the location after the location with the highest score value. For the exemplary score values and features in FIG. 5B, the ideal location for Feature 8 is after Feature 6.

Referring to FIG. 6, procedure 600 illustrates the process by which a target AAF is attempting to be reordered to an ideal location. If the target feature is not at its ideal location (tested in step 150) and the ideal location cannot be reached (tested in step 152), procedure 600 attempts to reorder the target AAF to a location closest to the ideal location (step 154). If the target AAF is not at its ideal location (tested in step 150) and the ideal location can be reached (tested in step 152), the target AAF is reordered to the ideal location (step 156). If the reorder, to either the location closest to the ideal location or to the ideal location, causes the target AAF to fail (tested in step 158 and step 160, respectively), the reorder is undone (step 162) and the Attempting flag is set to indicate an earlier or later order (step 164) depending on the reorder graph.

If the reorder to a location closest to the ideal location (step 154) has not caused the target AAF to fail (tested in step 158), the Attempting flag is set to indicate an earlier or later position (step 164) depending on the closest location relative to the ideal location, and procedure 600 ends. If the target AAF already is at the ideal location (tested in step 150) or the reorder to the ideal location does not cause the target feature to fail (tested in step 160), the Attempting flag is cleared (step 166) and procedure 600 ends.

Figure 7:
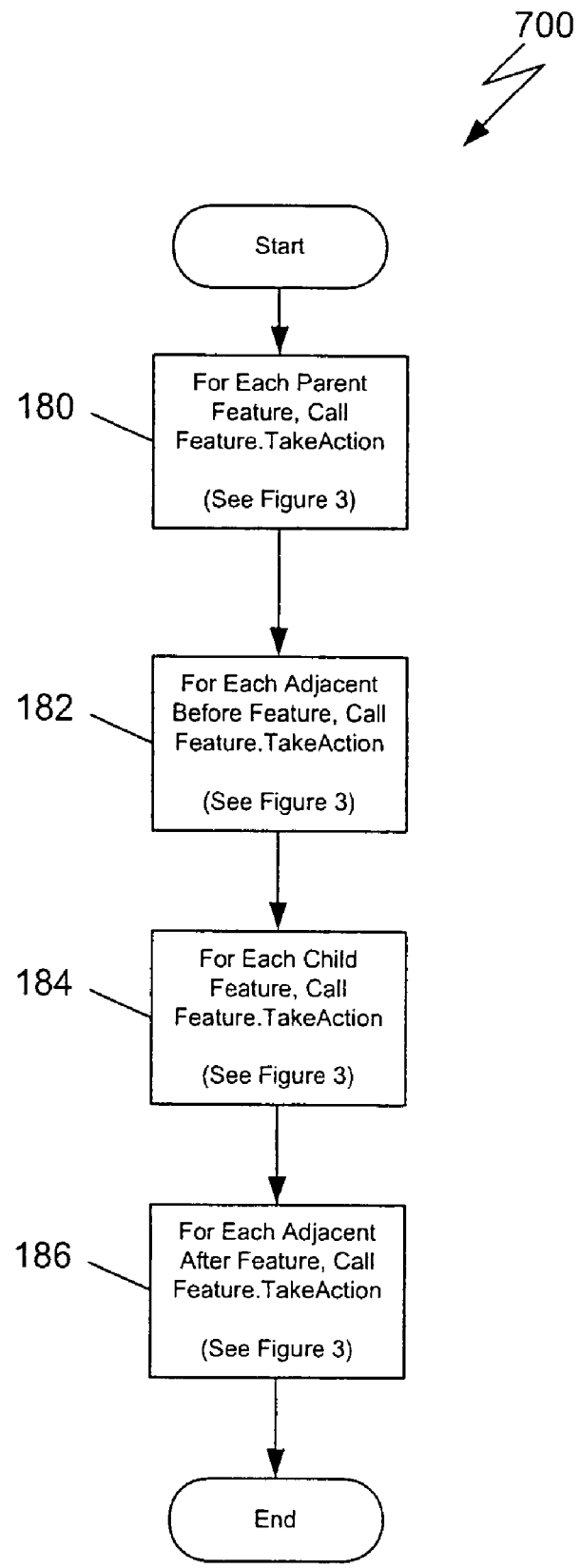
FIG. 7 illustrates a procedure that takes action on related features.

Referring to FIG. 7, procedure 700, TakeAction on Related Features, takes successive actions on features related to the target AAF. (As discussed with reference to FIG. 3, such actions depend on the feature type of the feature related to the target feature (e.g., a fillet, a draft, a fillet, a shell or an other specific type.) The related features can include each parent feature of the target feature (step 180), each adjacent feature before the target feature (step 182), each child feature of the target feature (step 184), and each adjacent feature after the target feature (step 186). The order of the related features can indicate the relative impact a particular related feature can have on the ordering of the target feature.

Figure 8:
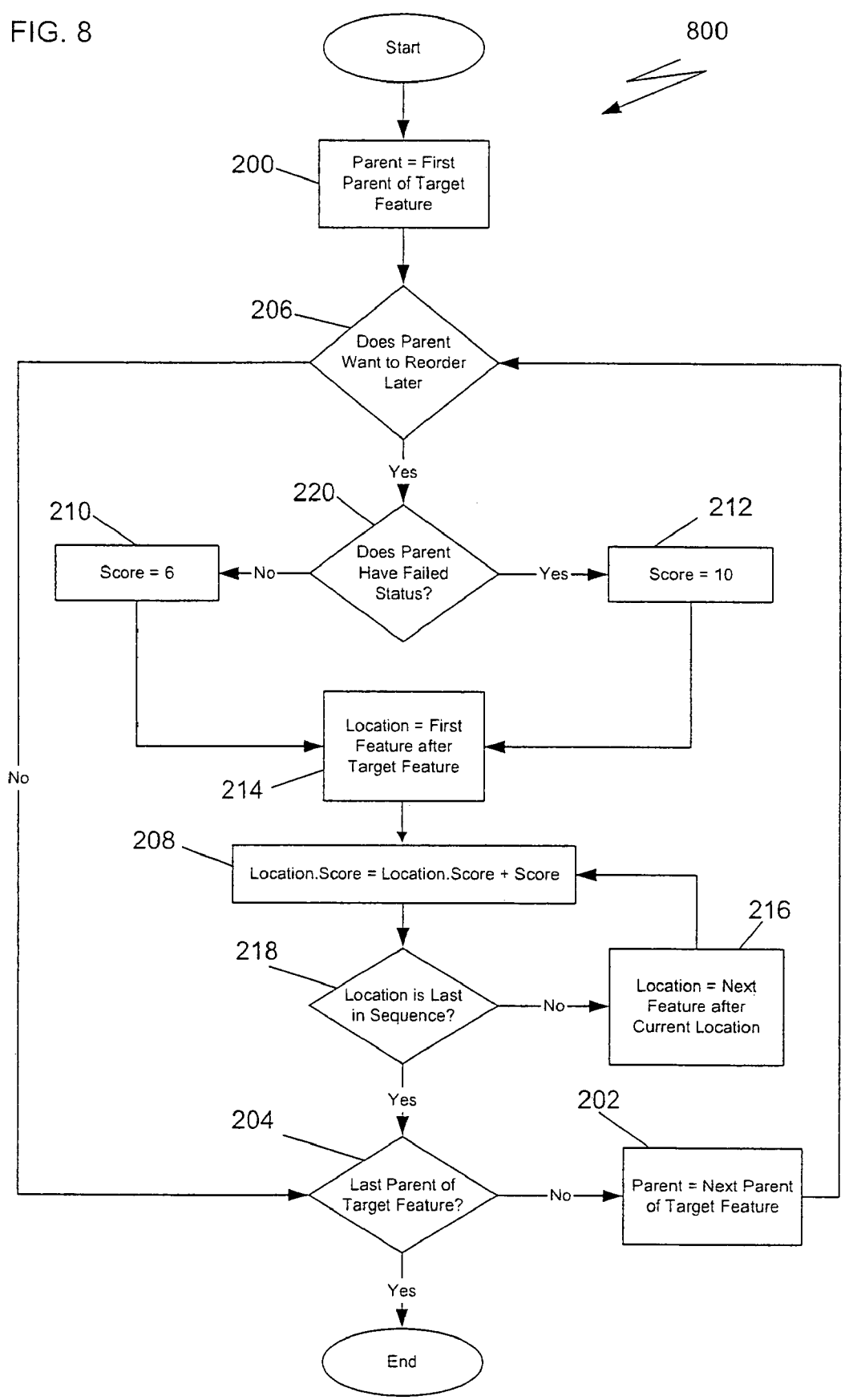
FIG. 8 illustrates a procedure that adjusts location scores.
Figure 9:
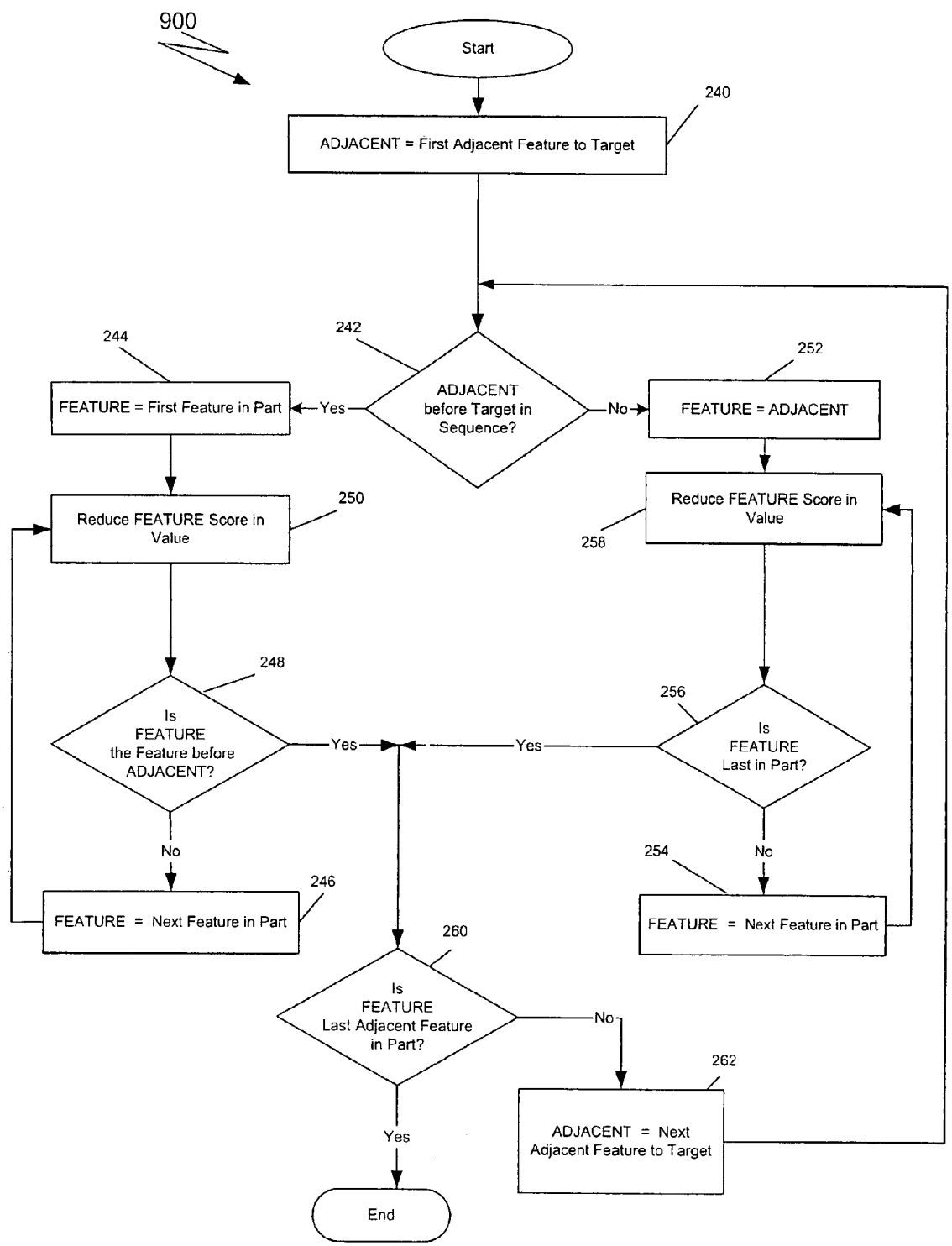
FIG. 9 illustrates a procedure that adjusts location scores for adjacent features.

FIG. 8 shows an exemplary procedure for determining a location score when a parent feature of the target feature wants to reorder to a location after the target feature, as called from procedure 500 (shown in FIG. 5A step 120). FIG. 9 shows an exemplary procedure for determining a location score to adjust the score to maintain the order relationship between adjacent features, as called from procedure 500 (shown in FIG. 5A step 128). Procedures that handle other reordering cases (e.g., as called from procedure 500 steps 122, 124, and 126) can be similarly configured, based on respective instructions provided in FIG. 5A. Other reordering schemes can be contemplated depending on the relationships between features maintained by the modeling system in which the AAFs are implemented.

Referring particularly to FIG. 8, procedure 800 cycles through the parent features of the target AAF, starting with the target AAF's first parent feature (step 200) and iteratively cycling to the target AAF's next parent feature (step 202), until the last parent feature has been processed (tested in step 204). If the parent in the current iteration wants to reorder later (tested in step 206), the location scores for each feature located in the feature history after the target feature are increased (step 208) by a score value (set in step 210 or step 212), beginning with the first feature located in the feature history after the target feature (step 214) and iteratively cycling to the next location (step 216) until the last location has been processed (step 218). The score value depends on whether the parent has a failed status (as determined at step 220).

In one illustrative embodiment, score values for not failed and failed parent features are shown as 6 and 10, respectively (set in steps 210 and 212, respectively). In alternative embodiments, each of these values may vary. The relative values of the scores can indicate the relative impact that the reordering of the related feature can have on the ordering of the target feature. In various alternative embodiments, score values may depend on the type of relationship and failure status of the features. Exemplary scoring values may be as follows:

Failed Parent=10
Parent=6
Failed Child=10
Child=6
Failed Adjacent Feature=4
Adjacent Feature=2

FIG. 9 illustrates procedure 900, which cycles through each feature adjacent to the target feature, starting with the first adjacent feature to the target feature (step 240). Procedure 900 checks whether the adjacent feature in the current iteration is located before the target feature in the feature order in the part (tested in step 242).

If the adjacent feature in the current iteration is located before the target feature in the feature order, procedure 900, proceeds with the first feature in the part (step 244), reduces in value the score of the corresponding location (step 250), and then checks whether the current feature is the feature immediately before the adjacent feature in the current iteration (tested in step 248). If the current feature is not the feature immediately before the adjacent feature in the current iteration, procedure 900 iteratively cycles the current feature to be the next feature in the part (step 246) and repeats the process of reducing the score of the current tested feature's corresponding location (step 250) and checking whether the current feature is the feature immediately before the adjacent feature in the current iteration (tested in step 248). Procedure 900 proceeds iteratively in this manner until it processes the current feature that is immediately before the adjacent feature in the current iteration (tested in step 248).

If the adjacent feature in the current iteration is not located before the target feature in the feature order (tested in step 242), procedure 900 proceeds with the adjacent feature(step 252), reduces in value the score of the current feature's corresponding location (step 258), and iteratively cycles to the next feature in in the part (step 254), reducing in value the score of its corresponding location (step 258) until it has processed the last feature in the part by feature order (tested in step 256).

Upon iteratively cycling through features either before or after the target feature, procedure 900 then determines if the previously processed adjacent feature in the current iteration is the last adjacent feature in the part (tested in step 260), and if so, procedure 900 ends. If the previously processed adjacent feature in the current iteration is not the last adjacent feature in the feature order in the part (tested in step 260), the next adjacent feature to the target feature is processed (step 262) in a new iteration.

Figure 10:
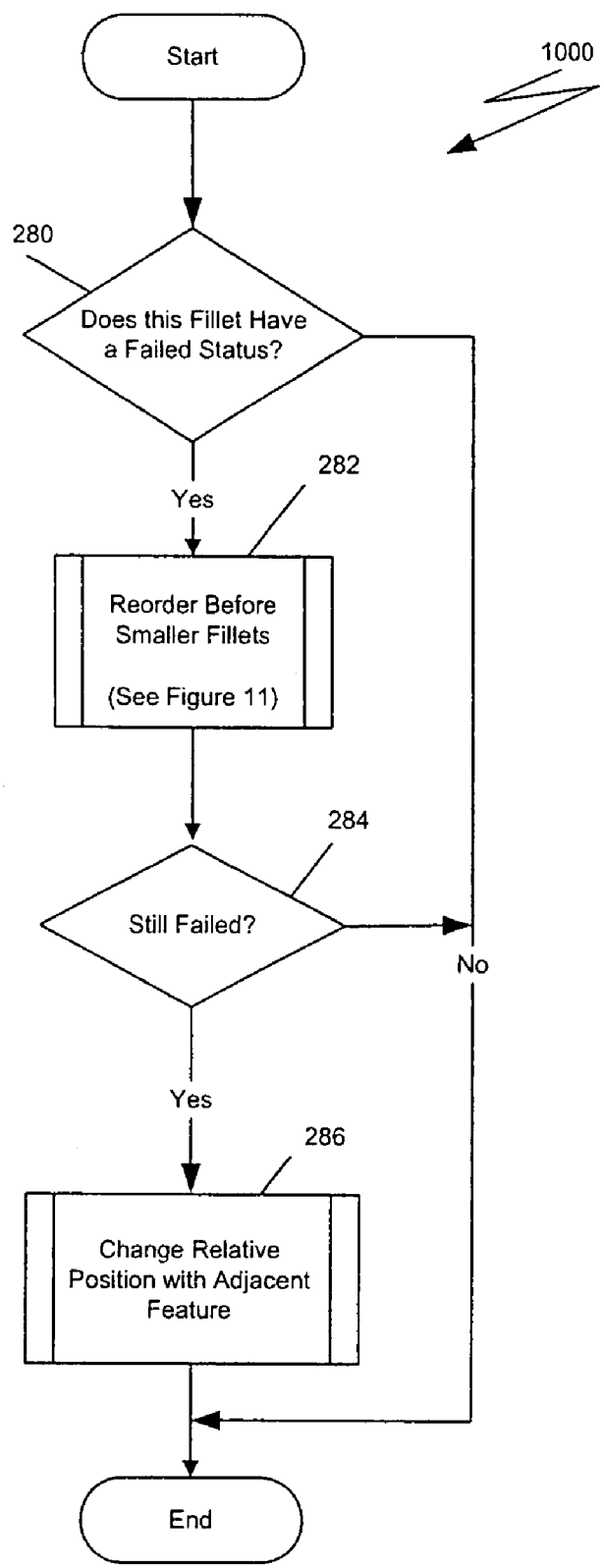
FIG. 10 illustrates a procedure that performs an action for a fillet feature.

Referring now to FIG. 10, a TakeAction procedure 1000 is shown for a target feature for which the feature type is a fillet (e.g., as called from procedure 300 step 88). For a fillet target feature that does not have a failed status (tested in step 280), procedure 1000 ends.

Figure 11:
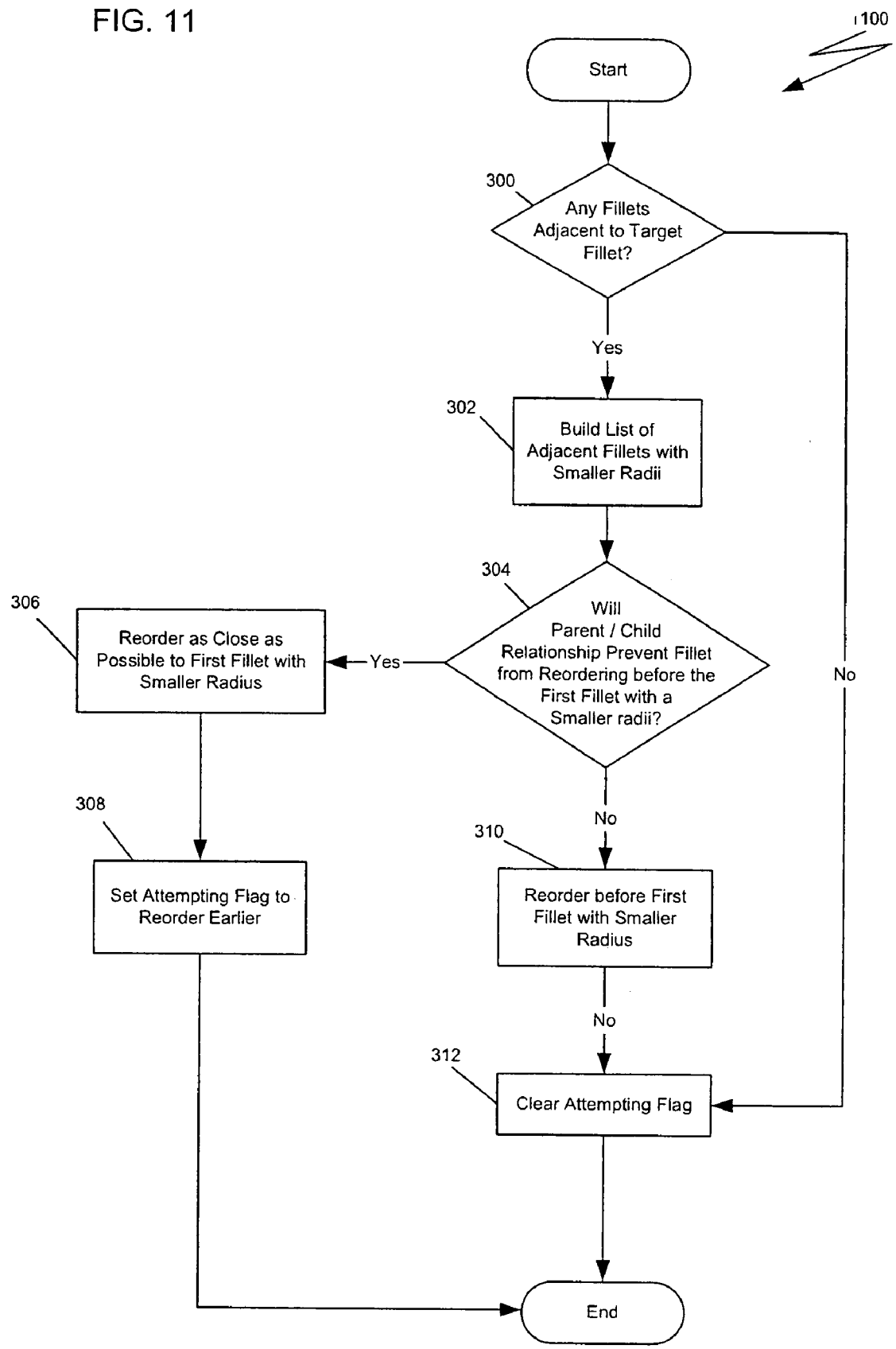
FIG. 11 illustrates a procedure that performs an action for a fillet feature.

For a fillet target feature with a failed status (tested in step 280), the feature is reordered before other related fillet features in the part that have a smaller radii than the target feature (step 282), which is illustrated in more detail in FIG. 11. If, after such reordering, the target feature still failed (tested in step 284), the target feature changes relative position with an adjacent feature (step 286) and procedure 1000 ends.

Referring now to FIG. 11, procedure 1100 is illustrated and shows step 282 in FIG. 10 in more detail. If there are any fillet features in the part adjacent to the target fillet feature (tested in step 300), a list is built that specifies each adjacent fillet feature that has a smaller radius than the target fillet feature (step 302). If a parent/child relationship would prevent the target feature from reordering before the first fillet feature that has a smaller radius (tested in step 304), the target feature is reordered as close as possible to the first adjacent fillet feature with a smaller radius (step 306), an Attempting flag is set to reorder earlier (step 308), and procedure 1100 then ends. If the parent/child relationship does not prevent the target feature from reordering before the first fillet feature (tested in step 304), the target feature reorders to a location before the first adjacent fillet feature with a smaller radius (step 310), the Attempting flag is cleared (step 312), and procedure 1100 ends.

Implementations of the present invention need not construct a reorder graph and score the locations of features. Rather, an implementation may simply provide a set of actions to assist in correcting an undesirable condition by, for example, reordering features, changing a parameter of a feature, or deleting or changing a reference. As mentioned and discussed with respect to FIG. 10 and FIG. 11, one such action may ensure that among related features, fillet features with larger radii precede fillet features with smaller radii in the feature history. Another action may reorder features such that a draft feature precedes one or more related fillet features. At least one purpose of such an action is to simplify operations to be performed on the fillet and draft features, and simplify the resulting geometry; otherwise, for example, the fillet features may need to be of variable radii. In practice, a modeling system will often fail in trying to draft (i.e., taper) a face that has fillets; whereas, failure is less likely when filleting a drafted face. In general, depending on feature type, each feature includes or has access to a set of actions that are pertinent to that particular type of feature. Moreover, actions are applied until the undesirable condition no longer exists.

The scope of features upon which an action operates is limited to those features that have either a direct or indirect relationship to the target feature. Relationships can include, but are not limited to, parent/child, adjacent geometry, and intersecting geometry. For example, a target fillet feature would not be reordered before every smaller fillet feature in a part; the target fillet feature would be reordered only before those features that have a relationship with the fillet feature being reordered, such as another fillet feature having geometry adjacent to the target feature.

Sometimes a feature may be defined from a collection of entities. For example, one fillet feature may be a collection of edges that are filleted. If reordering features does not repair an undesirable condition, an action may split a feature into pieces. The feature that is split may be the feature exhibiting the undesirable condition or a related feature. Splitting a feature into disjoint pieces may then allow the feature exhibiting the undesirable condition to reorder. A geometric analysis of the feature can determine whether various entities of a feature intersect or are adjacent to one another, and thereby determine whether the entities are disjointed from one another.

Additionally, an action may split a fillet feature having a collection of edges to be filleted into pieces depending on whether the faces adjacent to the edge are convex or concave (i.e., form an acute or an obtuse angle). As a result, the split feature is represented as two features—one feature that includes all edges having convex adjacent faces and another feature that includes all edges having concave adjacent faces.

An undesirable condition may occur when a feature loses a reference. This situation can arise when a feature is reordered to a location where an entity (such as an edge or face) that the reordered feature references no longer exists because the entity precedes the reordered feature in the feature list or hierarchy. In this case, the reordered feature can no longer locate the referenced entity to perform an operation. A solution to the condition where the entity exists but at a location that the reordered feature cannot find is to move the reordered feature to an earlier place in the model history (e.g., higher up in the feature hierarchy or earlier in a feature list) before the referenced entity has been lost and where the reordered feature can then successfully reference the entity. An action that corrects the lost reference condition analyzes parent/child relationships to find a location in the feature order where the lost entity is still known to exist.

As mentioned, an undesirable condition can be corrected by changing a parameter of a feature. An example of a parameter that may aid in the correction of an undesirable condition is a parameter that, when set, propagates a fillet to all tangent edges. An action that changes this parameter so that fillets do not propagate can correct the undesirable condition when the model is regenerated. Another example of an action that modifies a parameter to correct an undesirable condition is an action that changes the depth of an extrusion (e.g., changes a through hole, which is an extrusion with infinite depth, to a blind extrusion, which has a specified depth).

Furthermore, an action can delete or change a reference. One such action that changes a reference ensures that a reference refers to the highest level entity possible. Given that a set of edges composes a face and a design modification may cause the number of edges to change, the face is a more stable reference than an edge of that face. Moreover, rather than waiting for an undesirable condition to occur prior to performing certain procedures to automatically fix the condition, actions may prevent the undesirable condition (e.g., a failure) from occurring by anticipating the effect an operation on one feature may have on other features. An action that ensures that a reference refers to the highest level entity possible may also be used to prevent an undesirable condition from occurring.

Additionally, an implementation of the present invention allows a user to add additional constraints. By way of non-limiting example, such additional constraints could include restricting actions to locking the relative order between two features (e.g., ensuring that one feature always is ordered before a second feature). Locking the order of two features may be implemented to maintain the shape of the geometry where the two features come together. When adjusting the order of features, the present invention always respects all user-defined constraints.

A benefit to the present invention allows fillets, drafts, and other features to be created, deleted, or modified completely independently of the order of creation because any undesirable conditions (e.g., a failure caused by the order of creation or a failure caused by a lost feature reference) are automatically fixed by, for example, re-arranging the order, by removing the reference, by changing parameters, or by a combination of the foregoing. Actions are bounded by a particular scope of features that are related directly or indirectly, and therefore locally manage undesirable conditions.

The methods and systems described herein are not limited to a particular hardware or software configuration, and may find applicability in many computing or processing environments. For example, the procedures shown and described can be implemented in hardware or software, or a combination of hardware and software. The methods and systems can be implemented in one or more computer programs, where a computer program can be understood to include one or more processor executable instructions. The computer program(s) can execute on one or more programmable processors, and can be stored on one or more storage medium readable by the processor (including volatile and non-volatile memory and/or storage elements). The processor thus can access one or more input devices to obtain input data, and can access one or more output devices to communicate output data. The storage medium may be Random Access Memory (RAM), Redundant Array of Independent Disks (RAID), floppy disk, CD, DVD, magnetic disk, internal hard drive, external hard drive, memory stick, or other storage device capable of being accessed by a processor as provided herein, where such aforementioned examples are not exhaustive, and are for illustration and not limitation.

The computer program(s) is preferably implemented using one or more high level procedural or object-oriented programming languages to communicate with a computer system; however, the computer program(s) can be implemented in assembly or machine language, if desired. The language can be compiled or interpreted.

As provided herein, the processor(s) can be embedded in one or more devices that can be operated independently or together in a networked environment, where the network can include, for example, a Local Area Network (LAN), a wide area network (WAN), or both, and can include an intranet, the Internet, another network, or a combination thereof. The network(s) can be wired or wireless or a combination thereof and can use one or more communications protocols to facilitate communications between the different processors. The processors can be configured for distributed processing and can utilize, in some embodiments, a client-server model as needed. Accordingly, the methods and systems can utilize multiple processors and/or processor devices, and the processor instructions can be divided amongst such single or multiple processor/devices.

References to "a processor" or "the processor" can be understood to include one or more processors that can communicate in a stand-alone and/or a distributed environment(s), and can be configured to communicate via wired or wireless communications with other processors, where such one or more processors can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network using a variety of communications protocols, and unless otherwise specified, can be arranged to include a combination of external and internal memory devices, where such memory can be contiguous and/or partitioned based on the application.

Many additional changes in the details, materials, and arrangements, herein described and illustrated, can be made by those skilled in the art. Accordingly, it will be understood that the following claims are not to be limited to the embodiments disclosed herein, can include practices otherwise than specifically described, and are to be interpreted as broadly as allowed under the law.

A number of embodiments of the present invention have been described. Nevertheless, it will be understood that various modifications may be made without departing from the spirit and scope of the invention. For example, implementations may change the order in which operations are performed. Furthermore, depending on the needs of an implementation, particular operations described herein may be implemented as a combined operation, eliminated, added to, or otherwise rearranged.

Accordingly, other embodiments are within the scope of the following claims.

What is claimed is:

1. A computer-implemented method of processing data in a feature-based computer-aided design system, the method comprising:

determining an occurrence of an error condition that affects a feature of a three-dimensional model and that requires correction;

automatically correcting the condition by performing an action; and wherein:

the action is any one or combination of actions that reorder a sequence of features in the three-dimensional model, actions that change at least one parameter of the feature, and actions that delete or change a feature reference; and the action has one or more constraints that bound the action by determining on which if any of a plurality of directly and indirectly related features the action operates.

2. The computer-implemented method of claim 1, wherein a notification via an event-driven mechanism aids in determining that the feature has a condition that requires correction.

3. The computer-implemented method of claim 1, wherein:

the sequence of features is comprised of the feature and at least one other feature; and the one or more actions that reorder the sequence of features considers whether the feature is one of a parent feature and a child feature with respect to the one other feature.

4. The computer-implemented method of claim 1, wherein the actions that reorder the sequence of features considers a type of the feature.

5. The computer-implemented method of claim 1, further comprising reordering a first feature in the sequence of features prior to a second feature in the sequence of features, and wherein:

the first feature is a draft type; and the second feature is a fillet type.

6. The computer-implemented method of claim 1, further comprising reordering a first feature in the sequence of features prior to a second feature in the sequence of features, and wherein:

the first feature is a fillet type; and the second feature is a fillet type having a smaller fillet radius than the first feature.

7. The computer-implemented method of claim 1, wherein:

a directly related feature in the plurality of directly and indirectly related features has at least one of a parent relationship, a child relationship, a cross-part relationship, an adjacent relationship, and a geometrically connected relationship with the feature; and an indirectly related feature in the plurality of directly and indirectly related features has a direct relationship with another related feature in the plurality of directly and indirectly related features.

8. A computer-readable data storage medium comprising instructions of a feature-based computer-aided design system, the instructions for causing a computer to:

construct a three-dimensional model comprised of a plurality of features;

recognize a condition affecting a feature of the three-dimensional model that requires a corrective action;

execute the corrective action to correct the condition that affects the feature; and wherein:

the corrective action performs any one or combination of procedures that reorder an arrangement of the plurality of features, modify a parameter in the feature, change a reference of the feature, delete a reference of the feature, splits the feature into multiple features, and merges the feature with a second feature.

9. The data storage medium of claim 8, wherein the procedure operates on the feature and a subset of the plurality of features that are at least one of directly or indirectly related to the feature.

10. The data storage medium of claim 9, wherein a scope of features on which the procedure operates is further constrained by specifying a smaller number of features than the subset of the plurality of features.

11. The data storage medium of claim 8, wherein the procedure is constrained to ensure that a first feature and a second feature maintain a relative order with respect to one another.

12. The data storage medium of claim 8, wherein the corrective action executes after the feature receives an event-driven interrupt.

13. The data storage medium of claim 12, wherein one of a change of status and a setting of a data structure that acts as a flag causes the event-driven interrupt.

14. The data storage medium of claim 8, wherein the procedure that splits the feature splits the feature according to one of disjoint entities of the feature, and concave and convex elements of the feature.

15. The data storage medium of claim 8, wherein the procedure that reorders an arrangement of the plurality of features, reorders based on at least one of a feature type and a parent-child relationship.

16. The data storage medium of claim 15, wherein a feature type of the feature is a fillet and the procedure reorders one or more related fillet features having a smaller fillet radius later in a feature order that represents an order of construction of each one of the plurality of features.

17. The data storage medium of claim 15, wherein a feature type of the feature is a draft and the procedure reorders one or more related fillet features later in a feature order that represents an order of construction of each one of the plurality of features.

18. A feature-based computer-aided design system comprising:
 a processor operatively coupled to a data storage system, the data storage system storing a three-dimensional model comprised of a plurality of features and a data structure that specifies an order of construction of the plurality of features; and
 a data storage memory operatively coupled to the processor and comprising instructions to configure the processor to:
  enable the feature-based computer-aided design system to recognize a condition that affects a first feature in the plurality of features;
  enable the feature-based computer-aided design system to automatically take action to rectify the condition that affects the first feature; and
 wherein:
  the action taken has a scope of operation consisting of a set of features in the plurality of features having a relationship with the first feature; and
  the action is any one or combination of reordering, changing a parameter, removing a references, modifying a reference, splitting one of the first feature and a second feature, and merging one of the first feature and the second feature.

19. The feature-based computer-aided design system of claim 18, further comprising instructions to configure the processor to take one or more additional actions within the scope of operation.

20. The feature-based computer-aided design system of claim 19, further comprising instructions to configure the processor to:
 determine a type of the first feature; and
 select a reordering action based on the type.

21. The feature-based computer-aided design system of claim 20, wherein:
 the type of the first feature is a fillet; and
 the reordering action reorders the first fillet in the order of construction of the plurality of features prior to one or more fillet features in the scope of operation that have a smaller radii.

22. The feature-based computer-aided design system of claim 20, wherein:
 the type of the first feature is a draft; and
 the reordering action reorders the first fillet in the order of construction of the plurality of features prior to one or more fillet features in the scope of operation.

23. The feature-based computer-aided design system of claim 18, wherein splitting one of the first feature and a second feature splits one of the first feature and the second feature according to one of disjoint entities, and concave and convex faces adjacent to whichever of the first feature and second feature is being split.

* * * * *